(12) United States Patent
Umeda

(10) Patent No.: US 10,069,473 B2
(45) Date of Patent: Sep. 4, 2018

(54) PIEZOELECTRIC RESONATOR AND METHOD FOR MANUFACTURING THE SAME

(71) Applicant: Murata Manufacturing Co., Ltd., Nagaokakyo-shi, Kyoto-fu (JP)

(72) Inventor: Keiichi Umeda, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 371 days.

(21) Appl. No.: 15/002,525

(22) Filed: Jan. 21, 2016

(65) Prior Publication Data

US 2016/0156332 A1 Jun. 2, 2016

Related U.S. Application Data

(63) Continuation of application No. PCT/JP2014/070761, filed on Aug. 6, 2014.

(30) Foreign Application Priority Data

Aug. 21, 2013 (JP) ................................ 2013-171570

(51) Int. Cl.
*H03H 9/13* (2006.01)
*H03H 9/17* (2006.01)
(Continued)

(52) U.S. Cl.
CPC ............... *H03H 9/17* (2013.01); *H03H 3/02* (2013.01); *H03H 9/13* (2013.01); *H03H 9/174* (2013.01);
(Continued)

(58) Field of Classification Search
CPC ............ H03H 9/17; H03H 9/13; H03H 9/174; H03H 9/21; H03H 9/0504; H03H 3/02; H03H 2003/0407
See application file for complete search history.

(56) References Cited

U.S. PATENT DOCUMENTS 8,841,819 B2    9/2014  Nishihara et al.
9,679,765 B2 *  6/2017  Larson, III ........ H01L 21/02518
(Continued)

FOREIGN PATENT DOCUMENTS

CN    102468818 A    5/2012
JP    2009010926 A    1/2009
JP    2013110655 A    6/2013

OTHER PUBLICATIONS

C. Muller et al.; "Experimental evidence of thermoelastic damping in silicon tuning fork"; Proceedia Chemistry 1, 2009, pp. 1395-1398.
(Continued)

*Primary Examiner* — J. San Martin
(74) *Attorney, Agent, or Firm* — Arent Fox LLP

(57) ABSTRACT

A piezoelectric resonator that includes a single crystal Si layer, a piezoelectric thin film formed from aluminum nitride and provided on the single crystal Si layer, and first and second electrodes provided so as to sandwich the piezoelectric thin film. An element excluding nitrogen and aluminum is doped into the piezoelectric thin film formed from aluminum nitride, and a synthetic acoustic velocity of portions of the piezoelectric resonator other than the single crystal Si layer substantially coincide with the acoustic velocity of the single crystal Si layer.

20 Claims, 10 Drawing Sheets

(51) Int. Cl.
  *H03H 9/21* (2006.01)
  *H03H 3/02* (2006.01)
  *H03H 9/05* (2006.01)
  *H03H 3/04* (2006.01)

(52) U.S. Cl.
  CPC ............ *H03H 9/21* (2013.01); *H03H 9/0504* (2013.01); *H03H 2003/0407* (2013.01)

(56) References Cited

U.S. PATENT DOCUMENTS

| | | | |
|---|---|---|---|
| 2007/0040473 A1* | 2/2007 | Ballandras | H03H 3/04 310/320 |
| 2008/0296529 A1 | 12/2008 | Akiyama et al. | |
| 2012/0104900 A1 | 5/2012 | Nishihara et al. | |
| 2013/0127565 A1 | 5/2013 | Nishihara et al. | |
| 2014/0132117 A1* | 5/2014 | Larson, III | C23C 14/025 310/357 |
| 2015/0069882 A1* | 3/2015 | Umeda | H03H 9/02574 310/313 B |
| 2017/0214387 A1* | 7/2017 | Burak | H03H 9/17 |
| 2017/0294894 A1* | 10/2017 | Aida | H03H 9/172 |
| 2018/0145657 A1* | 5/2018 | Chen | H03H 3/08 |

OTHER PUBLICATIONS

J. Baborowski et al.; "Piezoelectically Activated Silicon Resonators"; Frequency Control Symposium, 2007, IEEE International, pp. 1210-1213.

International Search Report for PCT/JP2014/070761 dated Nov. 18, 2014.

Written Opinion for PCT/JP2014/070761 dated Nov. 18, 2014.

* cited by examiner

PIEZOELECTRIC RESONATOR AND METHOD FOR MANUFACTURING THE SAME

CROSS REFERENCE TO RELATED APPLICATIONS

The present application is a continuation of International application No. PCT/JP2014/070761, filed Aug. 6, 2014, which claims priority to Japanese Patent Application No. 2013-171570, filed Aug. 21, 2013, the entire contents of each of which are incorporated herein by reference.

FIELD OF THE INVENTION

The present invention relates to a piezoelectric resonator and a method for manufacturing the same.

BACKGROUND OF THE INVENTION

Heretofore, there has been known a piezoelectric MEMS (Micro Electro Mechanical Systems) vibrator in which an excitation portion including a piezoelectric thin film is formed on a single crystal Si layer.

For example, in the following Patent Document 1, a piezoelectric MEMS vibrator in which a piezoelectric thin film formed of scandium-containing aluminum nitride is provided on a Si single crystal has been disclosed. The piezoelectric MEMS vibrator described above has a so-called Cavity SOI (Silicon on insulator) structure in which a cavity portion is provided in a Si single crystal.

In addition, in the following Patent Document 2 and Non-Patent Documents 1 and 2, a piezoelectric MEMS vibrator in which a piezoelectric film layer formed of aluminum nitride is provided on a SOI substrate has also been disclosed.

Patent Document 1: Japanese Unexamined Patent Application Publication No. 2009-10926
Patent Document 2: U.S. Patent Application Publication No. 2010/0013360A1
Non-Patent Document 1: Procedia Chemistry1 (2009) 1395 to 1398
Non-Patent Document 2: Frequency Control Symposium, 2007, IEEE International 1210 to 1213

SUMMARY OF THE INVENTION

However, according to the piezoelectric MEMS vibrators disclosed in Patent Documents 1 and 2 and Non-Patent Documents 1 and 2, the variation in thickness of the Si layer was large. On the other hand, the resonance frequency depends on the thickness of the Si layer. Hence, according to the piezoelectric resonators disclosed in Patent Documents 1 and 2 and Non-Patent Documents 1 and 2, the variation in frequency was liable to occur. Hence, the frequency was required to be controlled by a trimming step provided therefor.

An object of the present invention is to provide a piezoelectric resonator capable of suppressing the variation in resonance frequency caused by the variation in thickness of Si and a method for manufacturing the piezoelectric resonator described above.

A piezoelectric resonator according to the present invention comprises a single crystal Si layer, a piezoelectric thin film formed from aluminum nitride and provided on the single crystal Si layer, and a first and a second electrode provided so as to sandwich the piezoelectric thin film. The piezoelectric thin film formed from aluminum nitride is doped with an element excluding nitrogen and aluminum. A synthetic acoustic velocity of portions of the piezoelectric resonator other than the single crystal Si layer substantially coincide with the acoustic velocity of the single crystal Si layer.

In a specific aspect of the piezoelectric resonator according to the present invention, the doping described above is performed so that the synthetic acoustic velocity of the portions other than the single crystal Si layer is made to substantially coincide with the acoustic velocity of the single crystal Si layer.

In another specific aspect of the piezoelectric resonator according to the present invention, the doping described above is performed using at least one type of element selected from the group consisting of scandium, yttrium, lutetium, and dysprosium.

In still another specific aspect of the piezoelectric resonator according to the present invention, the single crystal Si layer is doped with an n-type dopant, and the concentration of the n-type dopant is $1 \times 10^{19}/cm^3$ or more.

The piezoelectric resonator according to the present invention preferably further comprises a silicon oxide film layer disposed so as to be in contact with the first electrode or the second electrode.

The piezoelectric resonator according to the present invention preferably further comprises a dielectric film which has a high acoustic velocity as compared to that of the piezoelectric thin film formed from aluminum nitride doped with an element excluding nitrogen and aluminum and which is disposed so as to be in contact with the first electrode or the second electrode. The dielectric film having a high acoustic velocity described above is preferably formed from aluminum nitride doped with at least one element of boron and carbon.

In the piezoelectric resonator according to the present invention, the vibration mode is preferably width spreading vibration or in-plane bending vibration.

A method for manufacturing the piezoelectric resonator according to the present invention comprises the steps of preparing the single crystal Si layer, forming the first electrode on the single crystal Si layer, forming the piezoelectric thin film from aluminum nitride on the first electrode, and forming the second electrode on the piezoelectric thin film. The step of forming the piezoelectric thin film includes a step of doping an element excluding nitrogen and aluminum into the aluminum nitride in advance so that the synthetic acoustic velocity of portions of the piezoelectric resonator other than the single crystal Si layer is made to substantially coincide with the acoustic velocity of the single crystal Si layer.

In the piezoelectric resonator according to the present invention, the synthetic acoustic velocity of the portions of the piezoelectric resonator other than the single crystal Si layer substantially coincides with the acoustic velocity of the single crystal Si layer. As a result, the resonant frequency is no longer dependent on the thickness. Hence, the variation in resonant frequency caused by the variation in thickness can be suppressed.

By the method for manufacturing the piezoelectric resonator according to the present invention, a piezoelectric resonator capable of suppressing the variation in resonance frequency caused by the variation in thickness of Si can be provided.

DETAILED DESCRIPTION OF THE PREFERRED EMBODIMENTS

Hereinafter, embodiments of the present invention will be described with reference to the drawings.

Figure 1:
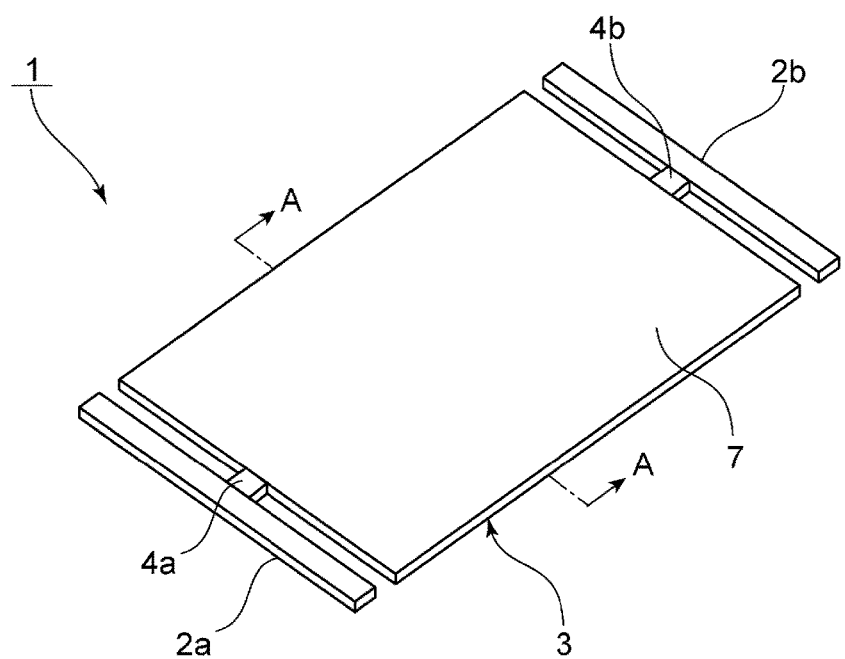
FIG. 1 is a perspective view showing the appearance of a piezoelectric resonator according to a first embodiment of the present invention.

FIG. 1 is a perspective view showing the appearance of a piezoelectric resonator 1 according to a first embodiment of the present invention. The piezoelectric resonator 1 is a resonator which includes support portions 2a and 2b, a vibration plate 3, and connection portions 4a and 4b and which uses width spreading vibration.

The vibration plate 3 is a rectangular-shaped plate and has a length direction and a width direction. The vibration plate 3 is connected to the support portions 2a and 2b with the connection portions 4a and 4b, respectively, provided therebetween. That is, the vibration plate 3 is supported by the support portions 2a and 2b. The vibration plate 3 is a vibrating body which vibrates in a width direction in a width spreading vibration mode when an alternating electric field is applied.

One end of each of the connection portions 4a and 4b is connected to a side-surface center of the vibration plate 3 at a short side. The side-surface center of the vibration plate 3 at a short side functions as the node of the width spreading vibration.

The support portions 2a and 2b are connected to the other ends of the connection portions 4a and 4b, respectively. The support portions 2a and 2b each extend to the two sides of each of the connection portions 4a and 4b. Although not particularly limited, in this embodiment, the length of each of the support portions 2a and 2b is the same as that of the short side of the vibration plate 3.

The support portions 2a and 2b and the connection portions 4a and 4b each may be formed of the same material as that of the vibration plate 3 or may be formed of a different material therefrom.

Figure 2:
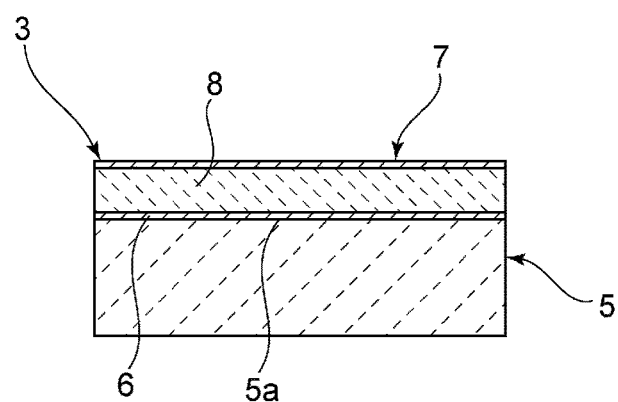
FIG. 2 is a cross-sectional view of the portion along the line A-A shown in FIG. 1.

FIG. 2 is a cross-sectional view of the portion along the line A-A shown in FIG. 1. As shown in FIG. 2, the vibration plate 3 is formed of a single crystal Si layer 5, first and second electrodes 6 and 7, a piezoelectric thin film 8.

In more particular, on the single crystal Si layer 5, the piezoelectric thin film 8 is provided. The first and the second electrodes 6 and 7 are provided so as to sandwich the piezoelectric thin film 8. In addition, in this embodiment, although not shown in the drawing, a seed layer may be provided on an upper surface 5a of the single crystal Si layer 5, and/or a protective layer may be provided on the upper surface of the second electrode 7. In addition, both the seed layer and the protective layer may not be provided. As the seed layer and the protective layer, the same material as that of the piezoelectric thin film 8 may be used.

Although not particularly limited, the single crystal Si layer is preferably an n-type semiconductor which is a degenerate semiconductor and preferably has an n-type dopant concentration of $1\times10^{19}/cm^3$ or more. The reason for this is that when a heavily doped n-type semiconductor is used, the variation in resonance frequency with the temperature can be further improved. In addition, as the n-type dopant described above, a group XV element, such as P, As, or Sb, may be mentioned by way of example.

A material of each of the first and the second electrodes 6 and 7 is not particularly limited, and an appropriate metal, such as Mo, Ru, Pt, Ti, Cr, Al, Cu, Ag, or W, or an alloy thereof may be used. In order to improve the Q value of the resonator, a material having a high Q value is also effectively used as an electrode material, and hence, Mo or W is preferably used.

The piezoelectric thin film 8 is formed of aluminum nitride doped with an element excluding nitrogen and aluminum. As the element which is to be doped, at least one type of element selected from the group consisting of scandium (Sc), yttrium (Y), lutetium (Lu), and dysprosium (Dy) is preferable. Sc which has a small rate of change in acoustic velocity with respect to the addition concentration and which is relatively strong against the variation in concentration is preferably used.

In the piezoelectric resonator 1 of this embodiment, a synthetic acoustic velocity of the acoustic velocities of the portions other than the single crystal Si layer 5 substantially coincides with the acoustic velocity of the single crystal Si layer. In addition, the acoustic velocity described in this specification represents a longitudinal wave acoustic velocity. In addition, although the acoustic velocities preferably exactly coincide with each other, they may substantially coincide with each other.

The synthetic acoustic velocity of the acoustic velocities of the portions other than the single crystal Si layer 5 is, for example, in this embodiment, the synthetic acoustic velocity of the acoustic velocities of the first and the second electrodes 6 and 7 and the acoustic velocity of the piezoelectric thin film 8. In general, compared to the thicknesses of the other layers, the thickness of each of the first and the second electrodes 6 and 7 is small, such as ¹⁄₂₀ to ¼ of the thickness of the piezoelectric thin film 8, and has a small contribution to the acoustic velocity. Hence, in this specification, the acoustic velocities of the first and the second electrodes 6 and 7 are ignored.

In this case, the synthetic acoustic velocity of the piezoelectric resonator 1 other than the single crystal Si layer 5 is the acoustic velocity of the piezoelectric thin film 8. Accordingly, in this embodiment, the acoustic velocity of the piezoelectric thin film 8 is required to coincide with the acoustic velocity of the single crystal Si layer 5.

As a method which enables the acoustic velocity of the piezoelectric thin film 8 to coincide with the acoustic velocity of the single crystal Si layer 5, there may be mentioned a method in which with respect to aluminum nitride forming the piezoelectric thin film 8, the dopant concentration of an element excluding nitrogen and aluminum is adjusted. In more particular, hereinafter, the above method will be described with reference to FIG. 3.

Figure 3:
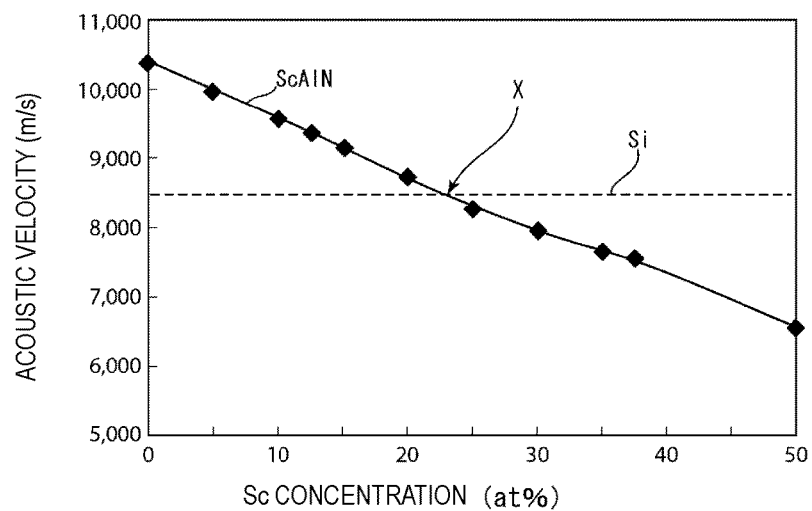
FIG. 3 is a graph showing the relationship of the acoustic velocity and a Sc concentration with respect to aluminum nitride (AlN).

FIG. 3 is a graph showing the relationship of the acoustic velocity and the Sc dopant concentration with respect to aluminum nitride (AlN). From FIG. 3, it is found that the acoustic velocity of a Sc-containing aluminum nitride (ScAlN) shown by a solid line in the graph is decreased with an increase in Sc concentration. The reason for this is that by addition of Sc, since Al is substituted with Sc, and the lattice distance in the a-axis direction is increased, Sc and Al atoms are likely to move in the c-axis direction, and Young's modulus is rapidly decreased. On the other hand, the acoustic velocity of the single crystal Si layer 5 shown by a dotted line is constant regardless of the Sc concentration. Hence, when the dopant concentration of Sc with respect to aluminum nitride is increased, at an X point in the graph, the acoustic velocity of ScAlN coincides with the acoustic velocity of the single crystal Si layer 5. As described above, when the dopant concentration of Sc is adjusted, the acoustic velocity of ScAlN (acoustic velocity of the piezoelectric thin film 8) can be made to coincide with the acoustic velocity of the single crystal Si layer 5.

The resonance frequency (fr) of the piezoelectric resonator 1 of this embodiment is represented by the following equation (1).

$$fr = \frac{1}{2w}\sqrt{\frac{1}{\rho s_{33}^E}} = \frac{1}{2w} v_{total} \quad \text{Equation (1)}$$

(fr: resonance frequency, w: width, ρ: density, $S^E$: elastic compliance, $v_{total}$ acoustic velocity of piezoelectric resonator)

From Equation (1), it is found $v_{total}$ represented by the following equation (2) is only dependent on the thickness.

$$v_{total} = \frac{t_1 v_1 + t_2 v_2}{t_{total}} \quad \text{Equation (3)}$$

($v_{total}$ acoustic velocity of piezoelectric resonator, $t_{total}$: thickness of piezoelectric resonator, $v_1$: acoustic velocity of single crystal Si layer, $t_1$: thickness of single crystal Si layer, $v_2$: acoustic velocity of piezoelectric thin film, $t_2$: thickness of piezoelectric thin film)

In the present invention, since the acoustic velocity of the piezoelectric thin film 8 is made to coincide with the acoustic velocity of the single crystal Si layer 5 by adjusting the dopant concentration of Sc, $v_1 = v_2$ holds. In this case, $v_{total}$ is represented by $v_{total} = v_1$ as shown by the following equation (3).

$$v_{total} = \frac{t_1 v_1 + t_2 v_2}{t_{total}} = \frac{t_1 v_1 + t_2 v_1}{t_{total}} = v_1 \quad \text{Equation (3)}$$

($v_{total}$ acoustic velocity of piezoelectric resonator, $t_{total}$: thickness of piezoelectric resonator, $v_1$: acoustic velocity of single crystal Si layer, $t_1$: thickness of single crystal Si layer, $v_2$: acoustic velocity of piezoelectric thin film, $t_2$: thickness of piezoelectric thin film)

As shown by Equation (3), since $v_{total}$ is not dependent on the thickness, the resonance frequency (fr) of Equation (1) is also not dependent on the thickness. Hence, the variation in resonance frequency caused by the variation in thickness can be suppressed.

Figure 4:
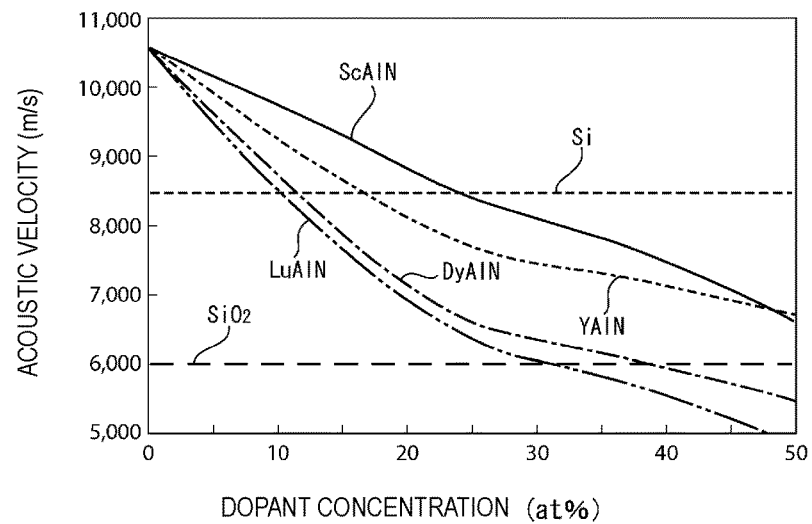
FIG. 4 is a graph showing the relationship of the acoustic velocity and a dopant concentration of each of Sc, Y, Dy, and Lu with respect to aluminum nitride (AlN).

FIG. 4 is a graph showing the relationship of the acoustic velocity and the dopant concentration of each of Sc, Y, Dy, and Lu with respect to aluminum nitride (AlN). From FIG. 4, it is found that even when Y, Dy, or Lu is used instead of Sc, as the dopant concentration is increased, the acoustic velocity can also be decreased so as to coincide with the acoustic velocity of the single crystal Si layer 5.

Figure 5:
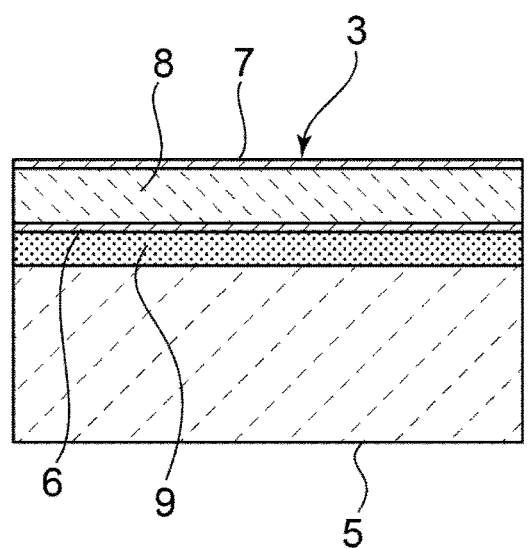
FIG. 5 is a cross-sectional view illustrating a first modified example of the first embodiment.

FIG. 5 is a cross-sectional view illustrating a first modified example of the first embodiment. In this modified example, on the upper surface of the single crystal Si layer 5, a silicon oxide film 9 is further disposed. In addition, in this modified example, the acoustic velocities of the first and the second electrodes 6 and 7 are also ignored. Hence, in this modified example, the synthetic acoustic velocity of the acoustic velocities of the portions other than the single crystal Si layer 5 is the synthetic acoustic velocity of the acoustic velocity of the piezoelectric thin film 8 and the acoustic velocity of the silicon oxide film 9. In this case, the acoustic velocity of the silicon oxide film 9 is lower than the acoustic velocity of the single crystal Si layer 5. Hence, by changing the film thickness ratio (thickness of the piezoelectric thin film 8/total thickness of the piezoelectric thin film 8 and the silicon oxide film 9), the synthetic acoustic velocity described above can be made to coincide with the acoustic velocity of the single crystal Si layer 5. In more particular, the first modified example will be described with reference to FIG. 6.

Figure 6:
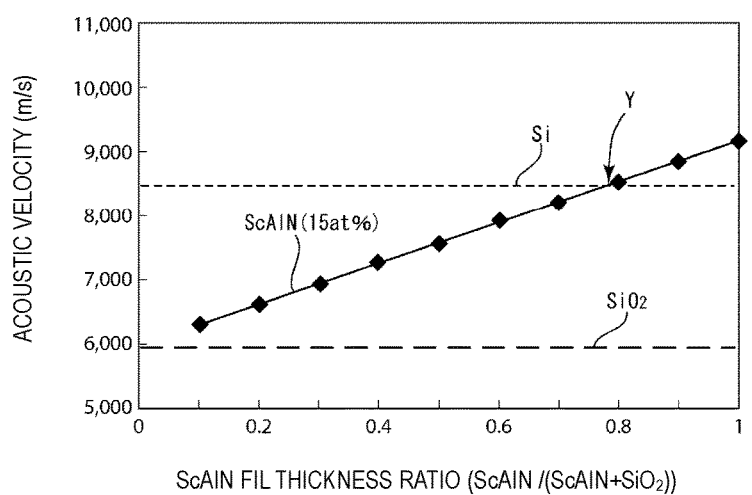
FIG. 6 is a graph showing the relationship of a synthetic acoustic velocity (synthetic acoustic velocity of the acoustic velocity of ScAlN and the acoustic velocity of $SiO_2$) and a ScAlN film thickness ratio (ScAlN/ScAlN+$SiO_2$) obtained when ScAlN having a Sc concentration of 15 atomic percent is used.

FIG. 6 is a graph showing the relationship of the synthetic acoustic velocity (synthetic acoustic velocity of the acoustic velocity of ScAlN and the acoustic velocity of $SiO_2$) and the ScAlN film thickness ratio (ScAlN/ScAlN+$SiO_2$) obtained when ScAlN having a Sc concentration of 15 atomic percent is used. From FIG. 6, it is found that as the ScAlN film thickness ratio is increased, the synthetic acoustic velocity is increased, and at a point Y in the graph, the synthetic acoustic velocity coincides with the acoustic velocity of the single crystal Si layer 5. That is, at the point Y in the graph, the acoustic velocity ($v_1$) of the single crystal Si layer 5 coincides with the synthetic acoustic velocity ($t_2 v_2 + t_3 v_3$)/($t_2 + t_3$) of the acoustic velocity ($v_2$) of ScAlN (piezoelectric thin film 8) and the acoustic velocity ($v_3$) of $SiO_2$ (silicon oxide film 9). Hence, the acoustic velocity ($v_{total}$) of the piezoelectric resonator 1 is represented by the following equation (4).

$$v_{total} = \frac{t_1v_1 + t_2v_2 + t_3v_3}{t_{total}} = \frac{t_1v_1 + (t_2+t_3)v_1}{t_{total}} = v_1 \qquad \text{Equation (4)}$$

($v_{total}$: acoustic velocity of piezoelectric resonator, $t_{total}$: thickness of piezoelectric resonator, $v_1$: acoustic velocity of single crystal Si layer, $t_1$: thickness of single crystal Si layer, $v_2$: acoustic velocity of piezoelectric thin film, $t_2$: thickness of piezoelectric thin film, $v_3$: acoustic velocity of SiO$_2$, $t_3$: thickness of SiO$_2$)

As shown by Equation (4), since being represented by $v_{total}=v_1$, the acoustic velocity ($v_{total}$) of the piezoelectric resonator is also not dependent on the thickness in this modified example. Hence, since the resonance frequency of Equation (1) is also not dependent on the thickness, the variation in resonance frequency caused by the variation in thickness is not likely to be generated.

As described above, when the concentration of scandium and/or the film thickness ratio of scandium to the silicon oxide film 9 is adjusted, the synthetic acoustic velocity of portions of the piezoelectric resonator other than the single crystal Si layer can be made to coincide with the acoustic velocity of the single crystal Si layer. As a result, the resonance frequency becomes not dependent on the thickness. That is, the variation in resonance frequency caused by the variation in thickness can be suppressed.

Figure 7:
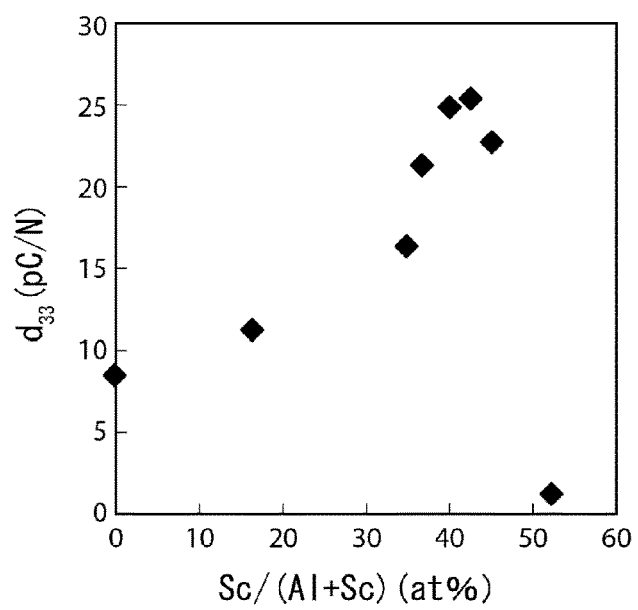
FIG. 7 is a graph showing the relationship of the piezoelectric constant ($d_{33}$) and the scandium (Sc) concentration.

FIG. 7 is a graph showing the relationship of the piezoelectric constant ($d_{33}$) and the scandium (Sc) concentration. From FIG. 7, it is found that the piezoelectric constant ($d_{33}$) shows the maximum value when the Sc concentration is approximately 40 atomic percent. In this case, a wideband resonator can be stably obtained. On the other hand, when the Sc concentration is high, as shown in FIG. 3, since the acoustic velocity of ScAlN (piezoelectric thin film 8) is decreased, the acoustic velocity described above may not be made to coincide with the acoustic velocity of the single crystal Si layer 5 in some cases.

Figure 8:
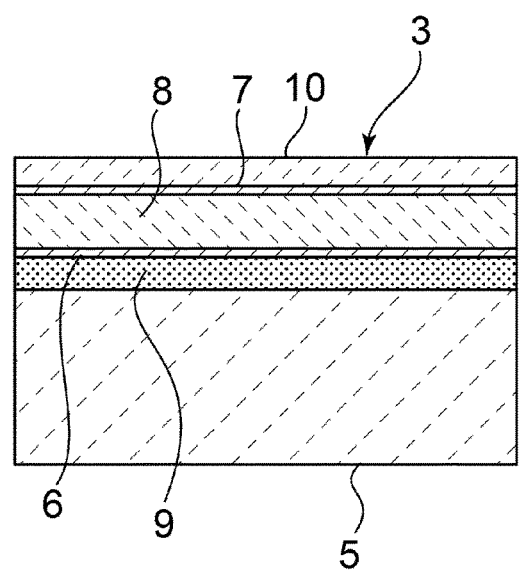
FIG. 8 is a cross-sectional view illustrating a second modified example of the first embodiment.

Hence, for example, as shown in FIG. 8, as is a second modified example of the first embodiment, a non-doped aluminum nitride layer 10 having a high acoustic velocity may be further disposed on the upper surface of the second electrode 7. By the structure as described above, the synthetic acoustic velocity of the portions of the piezoelectric resonator other than the single crystal Si layer 5 may be made to coincide with the acoustic velocity of the single crystal Si layer.

Figure 9:
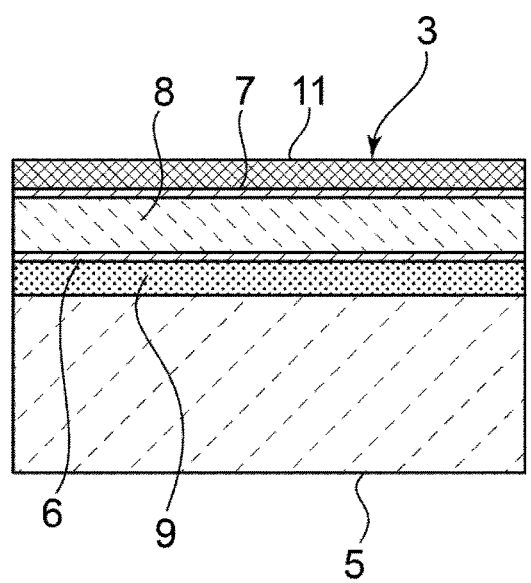
FIG. 9 is a cross-sectional view illustrating a third modified example of the first embodiment.
Figure 10:
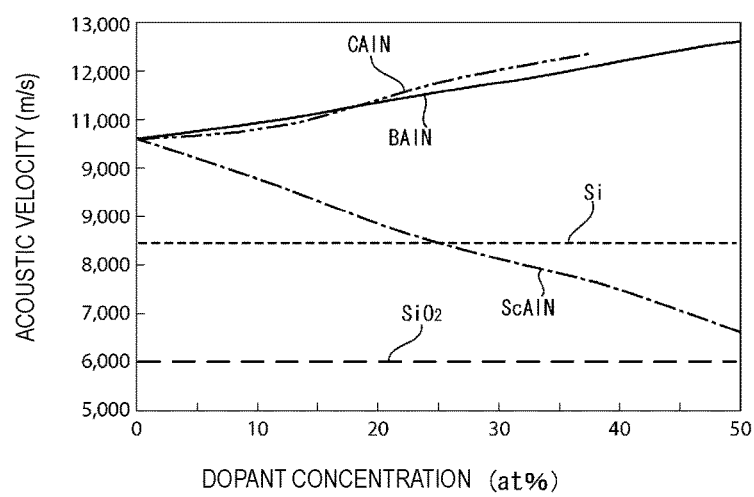
FIG. 10 is a graph showing the relationship of the acoustic velocity and a dopant concentration of each of B and C with respect to aluminum nitride.

In addition, as is a third modified example of the first embodiment shown in FIG. 9, when a boron (B)-containing aluminum nitride layer 11 is further disposed on the upper surface of the second electrode 7, the synthetic acoustic velocity of the portions of the piezoelectric resonator other than the single crystal Si layer 5 can be made to coincide with the acoustic velocity of the single crystal Si layer. The reason for this is that when doping is performed using B, as shown in FIG. 10, as the dopant concentration is increased, the acoustic velocity is increased.

In addition, since the temperature characteristics of the B-containing aluminum nitride (BAlN) are preferable, the temperature characteristics of the piezoelectric resonator 1 can also be improved.

In addition, in this embodiment, although B is used as the dopant, an element is not particularly limited as long as capable of increasing the acoustic velocity of aluminum nitride. As the element described above, for example, carbon may be mentioned by way of example. As shown in FIG. 10, it is found that in the case in which carbon (C) is used as the dopant, as the dopant concentration is increased, the acoustic velocity is also increased.

Figure 11:
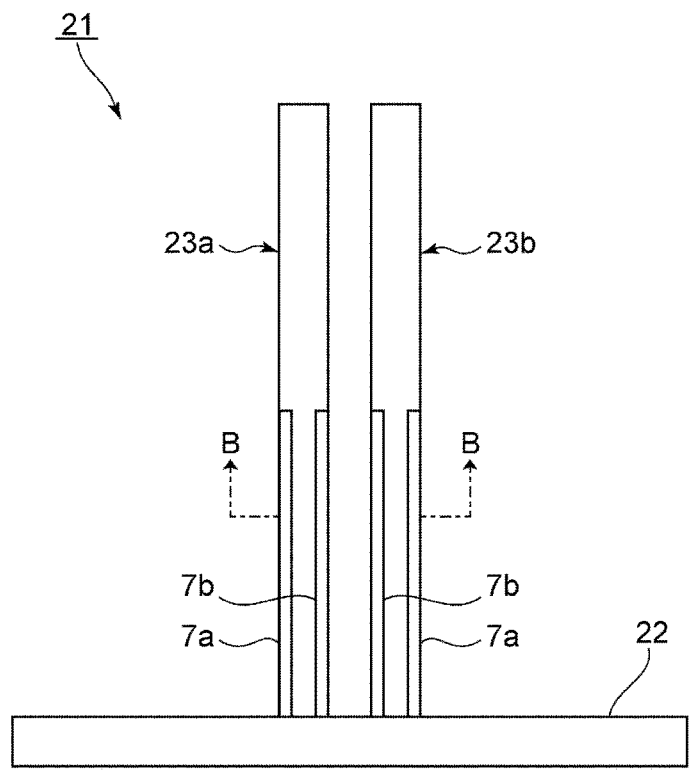
FIG. 11 is a perspective view showing the appearance of a piezoelectric resonator according to a second embodiment of the present invention.

Although the piezoelectric resonator 1 according to the first embodiment of the present invention is a resonator using the width spreading vibration, as is a piezoelectric resonator 21 according to a second embodiment shown in FIG. 11, a resonator using in-plane bending vibration may also be used. The piezoelectric resonator 21 described above includes a support portion 22 and an even number of vibrations arms. In addition, in this embodiment, two vibration arms 23a and 23b are provided.

The plane of each of the vibration arms 23a and 23b has a long and thin rectangular shape having a length direction and a width direction. One end of each of the vibration arms 23a and 23b is connected to the support portion 22 and functions as a fixed end, and the other end is displaceable and functions as a free end. The two vibration arms 23a and 23b extend in parallel to each other and have the same length. When an alternating electric field is applied, the vibration arms 23a and 23b are each a vibrating body which performs bending vibration in an in-plane bending vibration mode.

The support portion 22 is connected to the short sides of the vibration arms 23a and 23b. The support portion 22 extends in the width direction of each of the vibration arms 23a and 23b. The support portion 22 supports each of the vibration arms 23a and 23b in the form of a cantilever.

Figure 12:
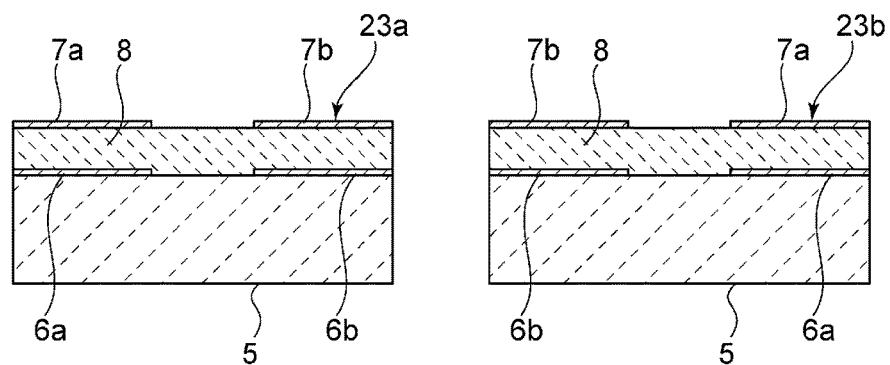
FIG. 12 is a cross-sectional view of the portion along the line B-B shown in FIG. 11.

FIG. 12 is a cross-sectional view of the portion along the line B-B shown in FIG. 11. As shown in FIG. 12, the vibration arms 23a and 23b are each formed of a single crystal Si layer 5, first electrodes 6a and 6b, second electrodes 7a and 7b, and a piezoelectric thin film 8. In more particular, on the single crystal Si layer 5, the first electrodes 6a and 6b are formed. The first electrode 6a and the first electrode 6b face each other in a width direction with a gap provided therebetween. The piezoelectric thin film 8 is formed on the single crystal Si layer 5 so as to cover the first electrodes 6a and 6b. The second electrodes 7a and 7b are formed on the piezoelectric thin film 8. The second electrode 7a and the second electrode 7b face each other in a width direction with a gap provided therebetween.

As an electrode material, for example, Mo, Ti, Al, Ru, or Pt may be used. The first and the second electrodes 6a, 6b, 7a, and 7b each may be a single layer film or a multilayer film formed of at least one of the above materials. A seed layer may be provided between the single crystal Si layer 5 and each of the first electrodes 6a and 6b. By the structure as described above, the crystallinity of each of the first electrodes 6a and 6b can be improved. As a seed layer material, for example, AlN, Ti, or ScAlN may be used.

In the second embodiment, by a method similar to that of the first embodiment, the synthetic acoustic velocity of the portions of the piezoelectric resonator other than the single crystal Si layer can be made to coincide with the acoustic velocity of the single crystal Si layer. That is, the synthetic acoustic velocity can be made so as not to be dependent on the thickness.

In addition, the resonance frequency of the in-plane bending vibrator which is the second embodiment can be represented by the following equation (5).

$$fr = \frac{\pi}{4\sqrt{3}} \frac{a}{l^2} \sqrt{\frac{2}{1+\sigma}} \sqrt{\frac{1}{\rho s_{33}^E}} = \frac{\pi}{4\sqrt{3}} \frac{a}{l^2} \sqrt{\frac{2}{1+\sigma}} v_{total} \qquad \text{Equation (5)}$$

(fr: resonance frequency, 1: length, a: width, σ: Poisson ratio, ρ: density, $S^E$: elastic compliance, $v_{total}$: acoustic velocity of piezoelectric resonator)

From Equation (5), it is found that at the resonance frequency of the in-plane bending vibrator, when the synthetic acoustic velocity is not dependent on the thickness, the resonance frequency is also not dependent on the thickness. Hence, in the in-plane bending vibrator, when the synthetic acoustic velocity of the portions of the piezoelectric resonator other than the single crystal Si layer 5 is made to coincide with the acoustic velocity of the single crystal Si layer, the variation in resonance frequency caused by the variation in thickness can also be suppressed.

A method for manufacturing the piezoelectric resonator according to the present invention comprises the steps of preparing the single crystal Si layer 5, forming the first electrode 6 on the single crystal Si layer 5, forming the piezoelectric thin film 8 from aluminum nitride on the first electrode 6, and forming the second electrode 7 on the piezoelectric thin film 8. In addition, in the step of forming the piezoelectric thin film 8 of the method for manufacturing the piezoelectric resonator according to the present invention, an element excluding nitrogen and aluminum is doped into aluminum nitride in advance so that the synthetic acoustic velocity of the portions of the piezoelectric resonator other than the single crystal Si layer 5 is made to coincide with the acoustic velocity of the single crystal Si layer.

Figure 17:
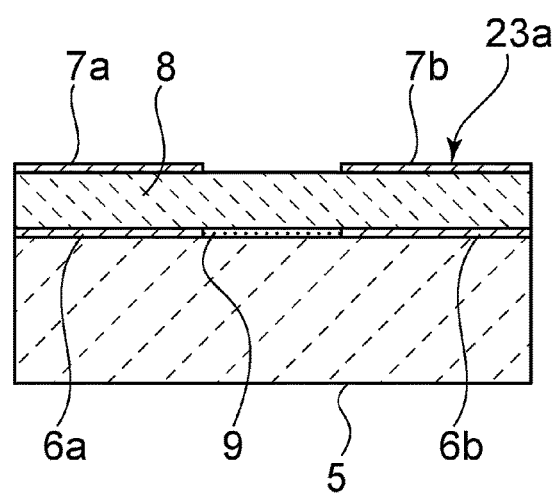
FIG. 17 is a cross-sectional view illustrating a modified example of the second embodiment.

As a modified example of the second embodiment shown in FIG. 17, the piezoelectric thin film 8 may be formed on the single crystal Si layer 5 with a silicon oxide film 9 provided therebetween. In this case, by a method similar to that of the first modified example of the first embodiment, the synthetic acoustic velocity of the portions of the piezoelectric resonator other than the single crystal Si layer 5 can be made to coincide with the acoustic velocity of the single crystal Si layer. In addition, instead of the silicon oxide film 9, a silicon nitride film may also be formed.

According to a method for manufacturing the piezoelectric resonator of the modified example of the second embodiment shown in FIG. 17, an electrically conductive film is formed by a CVD method or a sputtering method on the prepared single crystal Si layer 5. Next, by etching or the like, patterning of the electrically conductive film is performed. Accordingly, the first electrodes 6a and 6b are formed on the single crystal Si layer 5 so as to face each other with a gap provided therebetween. Subsequently, by using a sputtering method, a CVD method, or the like, the silicon oxide film 9 is formed. Next, by an etching method, a CMP method, or the like, the silicon oxide film 9 is removed so as to expose the first electrodes 6a and 6b. Subsequently, the piezoelectric thin film 8 is formed on the first electrodes 6a and 6b and the silicon oxide film 9.

Accordingly, since the step formed between the single crystal Si layer 5 and each of the first electrodes 6a and 6b can be filled with the silicon oxide film 9, the step can be made difficult to be generated in the piezoelectric thin film 8. As a result, the piezoelectric thin film 8 can be formed so that cracks and or voids are not likely to be formed therein. Hence, the elastic loss can be reduced, and furthermore, the Q value and the electromechanical coupling coefficient can be increased.

Next, concrete examples will be described. Incidentally, the present invention is not limited to the following examples.

Example 1

Under the following conditions, a width spreading vibrator was formed which had approximately the same structure as that of the piezoelectric resonator 1 according to the first modified example of the first embodiment described above.

Single crystal Si layer: resistivity: 1 mΩ·cm, n type (concentration: $7\times10^{19}/cm^3$), thickness: 10 μm $SiO_2$ layer: 400 nm Seed layer AlN (between lower electrode and $SiO_2$): 20 nm Lower electrode Mo: 100 nm Sc concentration of piezoelectric ScAlN: 25 atomic percent Upper electrode Mo: 100 nm

Example 2

Except that an in-plane bending vibrator was formed instead of the width spreading vibrator, no $SiO_2$ layer was provided, and the Sc concentration of the piezoelectric ScAlN was set to 38 atomic percent, a sample was formed in a manner similar to that of Example 1.

Example 3

Except that a high acoustic velocity layer AlN having a thickness of 350 nm was laminated on the upper electrode, and the Sc concentration of the piezoelectric ScAlN was set to 38 atomic percent, a sample was formed in a manner similar to that of Example 1.

Example 4

Except that AlN which was doped with B at a concentration of 15 atomic percent and which had a thickness of 250 nm was laminated on the upper electrode, and the Sc concentration of the piezoelectric ScAlN was set to 38 atomic percent, a sample was formed in a manner similar to that of Example 1.

Evaluation of Examples

The variation in frequency of each of the samples thus formed was evaluated by the resonance frequency using an impedance analyzer. In addition, the thickness of the single crystal Si layer was measured by an optical thickness measurement apparatus.

Hereinafter, the evaluation results are shown.

Example 1

Figure 13:
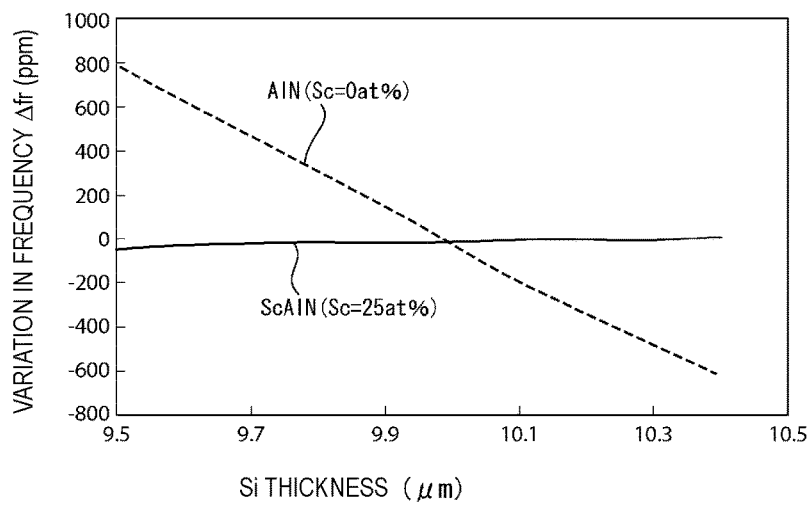
FIG. 13 is a graph showing the relationship of the variation in frequency and the thickness of Si of a width spreading vibrator according to Example 1.

FIG. 13 is a graph showing the relationship of the variation in resonance frequency and the thickness of Si of the width spreading vibrator of Example 1. A variation in resonance frequency of Δfr=156 ppm/ΔSi=0.1 μm before Sc doping was significantly improved to Δfr=6 ppm/ΔSi=0.1 In addition, since the heavily doped n-type Si was used, the variation in frequency with the temperature was also significantly improved.

Example 2

Figure 14:
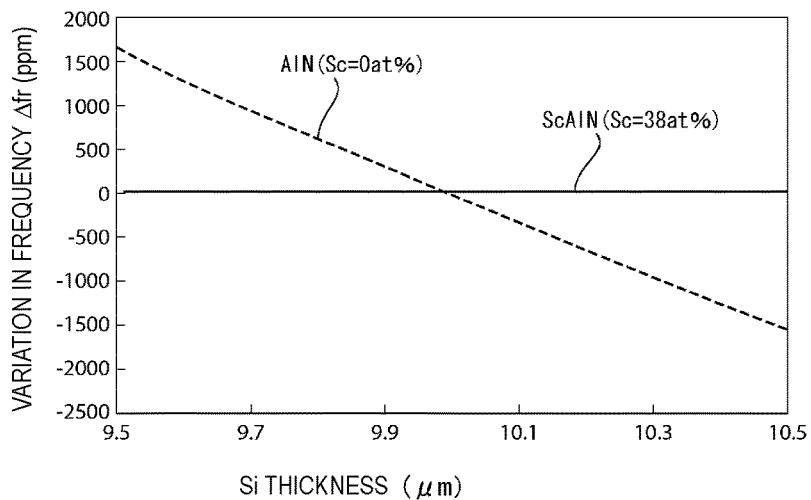
FIG. 14 is a graph showing the relationship of the variation in frequency and the thickness of Si of an in-plane bending vibrator according to Example 2.

FIG. 14 is a graph showing the relationship of the variation in resonance frequency and the thickness of Si of the in-plane bending vibrator of Example 2. A variation in resonance frequency of Δfr=317 ppm/ΔSi=0.1 μm before Sc doping was significantly improved to Δfr=6 ppm/ΔSi=0.1 In addition, since the heavily doped n-type Si was used, the variation in frequency with the temperature was also significantly improved.

Example 3

Figure 15:
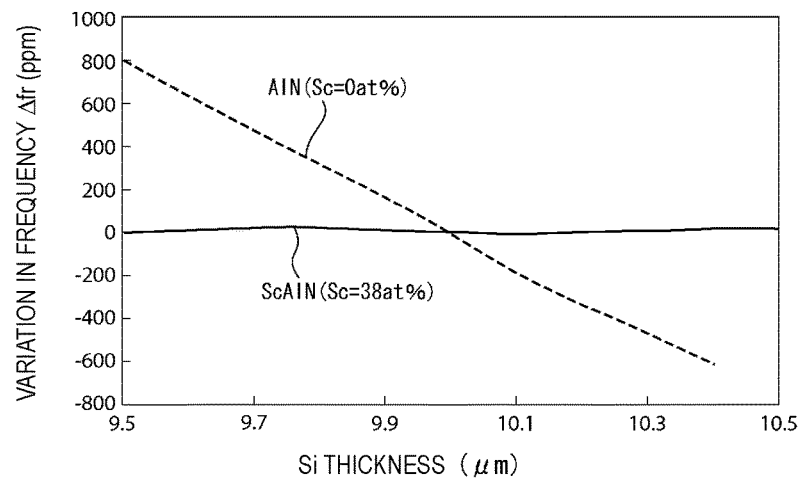
FIG. 15 is a graph showing the relationship of the variation in frequency and the thickness of Si of a width spreading vibrator according to Example 3.

FIG. 15 is a graph showing the relationship of the variation in resonance frequency and the thickness of Si of the width spreading vibrator of Example 3. A variation in resonance frequency of Δfr=156 ppm/ΔSi=0.1 μm before Sc doping was significantly improved to Δfr=0.2 ppm/ΔSi=0.1 In addition, in Example 3, since Sc was doped at a high concentration, compared to a fractional bandwidth of 0.78% of Example 1, the fractional bandwidth was increased to 1.32%.

Example 4

Figure 16:
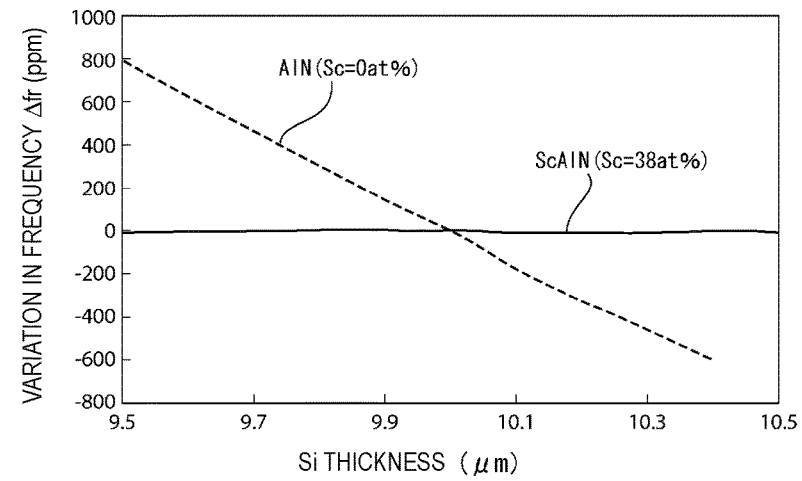
FIG. 16 is a graph showing the relationship of the variation in frequency and the thickness of Si of a width spreading vibrator according to Example 4.

FIG. 16 is a graph showing the relationship of the variation in resonance frequency and the thickness of Si of the width spreading vibrator of Example 4. A variation in resonance frequency of Δfr=156 ppm/ΔSi=0.1 μm before Sc doping was significantly improved to Δfr=1 ppm/ΔSi=0.1 μm. In Example 4, since AlN was doped with B, the temperature characteristics were good as compared to those of Example 3, and the temperature characteristics of the vibrator were improved.

REFERENCE SIGNS LIST 1 piezoelectric resonator
2a, 2b support portion
3 vibration plate
4a, 4b connection portion
5 single crystal Si layer
5a upper surface
6, 6a, 6b first electrode
7, 7a, 7b second electrode
8 piezoelectric thin film
9 silicon oxide film
10 aluminum nitride layer
11 B-containing aluminum nitride layer
21 piezoelectric resonator
22 support portion
23a, 23b vibration arm

The invention claimed is:

1. A piezoelectric resonator comprising:
a single crystal Si layer;
an aluminum nitride piezoelectric film adjacent the single crystal Si layer, the aluminum nitride piezoelectric film being doped with an element excluding nitrogen and aluminum; and
a first and a second electrode sandwiching the aluminum nitride piezoelectric film,
wherein a synthetic acoustic velocity of portions of the piezoelectric resonator other than the single crystal Si layer coincide with an acoustic velocity of the single crystal Si layer, and the synthetic acoustic velocity is attained based on a doping concentration and a film thickness of the aluminum nitride piezoelectric film.

2. The piezoelectric resonator according to claim 1, wherein the synthetic acoustic velocity of the portions of the piezoelectric resonator other than the single crystal Si layer exactly coincides with the acoustic velocity of the single crystal Si layer.

3. The piezoelectric resonator according to claim 1, wherein the element is least one of scandium, yttrium, lutetium, and dysprosium.

4. The piezoelectric resonator according to claim 1, wherein the single crystal Si layer is doped with an n-type dopant.

5. The piezoelectric resonator according to claim 4, wherein a concentration of the n-type dopant is $1\times10^9/cm^3$ or more.

6. The piezoelectric resonator according to claim 1, further comprising a silicon oxide film layer in contact with the first electrode or the second electrode.

7. The piezoelectric resonator according to claim 1, further comprising a dielectric film which has a higher acoustic velocity compared to that of the aluminum nitride piezoelectric film and in contact with the first electrode or the second electrode.

8. The piezoelectric resonator according to claim 1, wherein a vibration mode of the piezoelectric resonator is width spreading vibration or in-plane bending vibration.

9. A method for manufacturing a piezoelectric resonator, the method comprising:
preparing a single crystal Si layer;
forming a first electrode on the single crystal Si layer;
forming an aluminum nitride piezoelectric film on the first electrode, the aluminum nitride piezoelectric film being doped with an element excluding nitrogen and aluminum so that a synthetic acoustic velocity of portions of the piezoelectric resonator other than the single crystal Si layer coincide with an acoustic velocity of the single crystal Si layer, and the synthetic acoustic velocity is attained based on a doping concentration and a film thickness of the aluminum nitride piezoelectric film; and
forming a second electrode on the aluminum nitride piezoelectric film.

10. The method for manufacturing the piezoelectric resonator according to claim 9, wherein the synthetic acoustic velocity of the portions of the piezoelectric resonator other than the single crystal Si layer exactly coincides with the acoustic velocity of the single crystal Si layer.

11. The method for manufacturing the piezoelectric resonator according to claim 9, wherein the element is least one of scandium, yttrium, lutetium, and dysprosium.

12. The method for manufacturing the piezoelectric resonator according to claim 9, wherein the single crystal Si layer is doped with an n-type dopant.

13. The method for manufacturing the piezoelectric resonator according to claim 12, wherein a concentration of the n-type dopant is $1\times10^9/cm^3$ or more.

14. The method for manufacturing the piezoelectric resonator according to claim 9, further comprising forming a silicon oxide film layer on the first electrode or the second electrode.

15. The method for manufacturing the piezoelectric resonator according to claim 9, further comprising forming a dielectric film which has a higher acoustic velocity compared to that of the aluminum nitride piezoelectric film on the first electrode or the second electrode.

16. A piezoelectric resonator further comprising:
a single crystal Si layer;
an aluminum nitride piezoelectric film adjacent the single crystal Si layer, the aluminum nitride piezoelectric film being doped with an element excluding nitrogen and aluminum;
a first and a second electrode sandwiching the aluminum nitride piezoelectric film;
a silicon oxide film layer in contact with the first electrode or the second electrode; and
a dielectric film which has a higher acoustic velocity compared to that of the aluminum nitride piezoelectric film and in contact with the first electrode or the second electrode, wherein a synthetic acoustic velocity of portions of the piezoelectric resonator other than the single crystal Si layer coincide with an acoustic velocity of the single crystal Si layer.

17. The piezoelectric resonator according to claim 16, wherein the dielectric film comprises aluminum nitride doped with at least one element of boron and carbon.

18. A piezoelectric resonator comprising:
a single crystal Si layer;
an aluminum nitride piezoelectric film adjacent the single crystal Si layer, the aluminum nitride piezoelectric film being doped with an element excluding nitrogen and aluminum;
a first and a second electrode sandwiching the aluminum nitride piezoelectric film;
a dielectric film which has a higher acoustic velocity compared to that of the aluminum nitride piezoelectric film and in contact with the first electrode or the second electrode,
wherein a synthetic acoustic velocity of portions of the piezoelectric resonator other than the single crystal Si layer coincide with an acoustic velocity of the single crystal Si layer, and
wherein the dielectric film comprises aluminum nitride doped with at least one element of boron and carbon.

19. A method for manufacturing the piezoelectric resonator, the method comprising:
preparing a single crystal Si layer;
forming a first electrode on the single crystal Si layer;
forming an aluminum nitride piezoelectric film on the first electrode, the aluminum nitride piezoelectric film being doped with an element excluding nitrogen and aluminum so that a synthetic acoustic velocity of portions of the piezoelectric resonator other than the single crystal Si layer coincide with an acoustic velocity of the single crystal Si layer;
forming a second electrode on the aluminum nitride piezoelectric film;
forming a silicon oxide film layer on the first electrode or the second electrode; and
forming a dielectric film which has a higher acoustic velocity compared to that of the aluminum nitride piezoelectric film on the first electrode or the second electrode.

20. The method for manufacturing the piezoelectric resonator according to claim 19, wherein the dielectric film comprises aluminum nitride doped with at least one element of boron and carbon.

* * * * *